(12) United States Patent
Lu et al.

(10) Patent No.: US 12,173,454 B2
(45) Date of Patent: *Dec. 24, 2024

(54) PIEZOELECTRIC-BASED ASPHALT LAYER FOR ENERGY HARVESTING ROADWAY

(71) Applicant: UNIVERSITY OF SOUTH FLORIDA, Tampa, FL (US)

(72) Inventors: Qing Lu, Tampa, FL (US); Lukai Guo, Tampa, FL (US)

(73) Assignee: UNIVERSITY OF SOUTH FLORIDA, Tampa, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/479,539

(22) Filed: Oct. 2, 2023

(65) Prior Publication Data

US 2024/0026611 A1    Jan. 25, 2024

Related U.S. Application Data

(63) Continuation of application No. 16/840,832, filed on Apr. 6, 2020, now Pat. No. 11,773,542.

(60) Provisional application No. 62/830,722, filed on Apr. 8, 2019.

(51) Int. Cl.
    *E01C 1/00*      (2006.01)
    *H02N 2/18*      (2006.01)

(52) U.S. Cl.
    CPC ............ *E01C 1/002* (2013.01); *H02N 2/183* (2013.01)

(58) Field of Classification Search
    CPC ................. H02N 2/183; E01C 1/002
    See application file for complete search history.

(56) References Cited

U.S. PATENT DOCUMENTS

| | | | |
|---|---|---|---|
| 11,773,542 B1 * | 10/2023 | Lu ..................... | H10N 30/852 |
| | | | 404/1 |
| 2005/0127677 A1 * | 6/2005 | Luttrull ............... | H02N 2/18 |
| | | | 290/1 R |

(Continued)

FOREIGN PATENT DOCUMENTS

| | | | | |
|---|---|---|---|---|
| CN | 111180569 A | * | 5/2020 | |
| CN | 113077636 B | * | 8/2022 | ............ E01C 11/00 |

(Continued)

OTHER PUBLICATIONS

Shu, Y. C., and I. C. Lien. "Analysis of power output for piezoelectric energy harvesting systems." Smart materials and structures 15.6 (2006): 1499.

(Continued)

*Primary Examiner* — J. San Martin
(74) *Attorney, Agent, or Firm* — Quarles & Brady LLP

(57) ABSTRACT

An energy harvesting roadway that includes a plurality of road segments and a power storage device electrically coupled to the plurality of road segments. Each of the plurality of road segments can include a surface asphalt layer, a first conductive asphalt layer located under the surface asphalt layer, a piezoelectric-based asphalt layer located between the first conductive layer and a second (Continued)

conductive layer located above a base asphalt layer. The piezoelectric-based asphalt layer can include a plurality of rigid piezoelectric elements and an insulating filler.

20 Claims, 4 Drawing Sheets

(56) References Cited

U.S. PATENT DOCUMENTS

| | | | |
|---|---|---|---|
| 2007/0028958 A1* | 2/2007 | Retti | H02N 2/18 |
| | | | 136/244 |
| 2009/0195124 A1 | 8/2009 | Abramovich et al. | |
| 2009/0195226 A1* | 8/2009 | Abramovich | E01B 26/00 |
| | | | 322/2 R |
| 2010/0045111 A1* | 2/2010 | Abramovich | E01B 26/00 |
| | | | 307/43 |
| 2011/0302858 A1* | 12/2011 | Siewert | H10N 10/00 |
| | | | 52/173.3 |
| 2013/0175902 A1* | 7/2013 | Abu Al-Rubb | H02N 2/181 |
| | | | 310/339 |
| 2014/0300250 A1* | 10/2014 | Marin Ramirez | H02N 2/18 |
| | | | 310/319 |
| 2020/0250972 A1* | 8/2020 | Cheng | E01F 9/559 |
| 2023/0323610 A1* | 10/2023 | Botts | E01C 23/00 |
| | | | 404/71 |

FOREIGN PATENT DOCUMENTS

| | | |
|---|---|---|
| JP | 2011511619 A * | 4/2011 |
| WO | WO-2023225474 A1 * | 11/2023 |

OTHER PUBLICATIONS

Roshani, Hossein, et al. "Energy harvesting from asphalt pavement roadways vehicle-induced stresses: A feasibility study." Applied Energy 182 (2016): 210-218.

Guo, Lukai,; et al. "Numerical analysis of a new piezoelectric-based energy harvesting pavement system: Lessons from laboratory-based and field-based simulations." Applied Energy 235 (2019): 963-977.

Guo, Lukai; et al. "Modeling a new energy harvesting pavement system with experimental verification." Applied energy 208 (2017): 1071-1082.

Guo, Lukai. "Development of a New Piezoelectric-based Energy Harvesting Pavement System." (2018).

* cited by examiner

PIEZEOELECTRIC-BASED ASPHALT LAYER FOR ENERGY HARVESTING ROADWAY

CROSS-REFERENCE TO RELATED APPLICATIONS

This application is a Continuation of U.S. patent application Ser. No. 16/840,832, filed on Apr. 6, 2020, which claims priority to, and the benefit of, U.S. Provisional Patent Application No. 62/830,722, filed on Apr. 8, 2019 and entitled "PIEZOELECTRIC-BASED ASPHALT LAYER FOR ENERGY HARVESTING ROADWAY," each of which, including APPENDIX A of Provisional Patent Application No. 62/830,722, is incorporated by reference as if set forth herein in its entirety.

BACKGROUND

Roadways often involve large amounts of waste energy. For example, the friction of car tires driving over asphalt results in waste heat. Likewise, the weight of a vehicle temporarily stresses and deforms the asphalt as the vehicle travels over the asphalt. In both cases, the heat from friction or the deformation of the asphalt is energy that is not normally recovered during use of the roadway.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

Disclosed are various approaches for an energy harvesting roadway manufactured using piezoelectric-based asphalt layers, which includes a mixture or combination of piezoelectric materials with conventional paving materials such as asphalt. The energy harvesting roadway can be paved using piezeoelectric-based asphalt layer, which can be connected using wires to an energy storage device. As vehicles travel across the piezeoelectric-based asphalt layer, the deformation of the piezeoelectric-based asphalt layer creates electricity as a result of the piezoelectric effect. This energy can then be stored in an energy storage device for subsequent use. In the following discussion, a general description of the system and its components is provided, followed by a discussion of the operation of the same.

Figure 1:
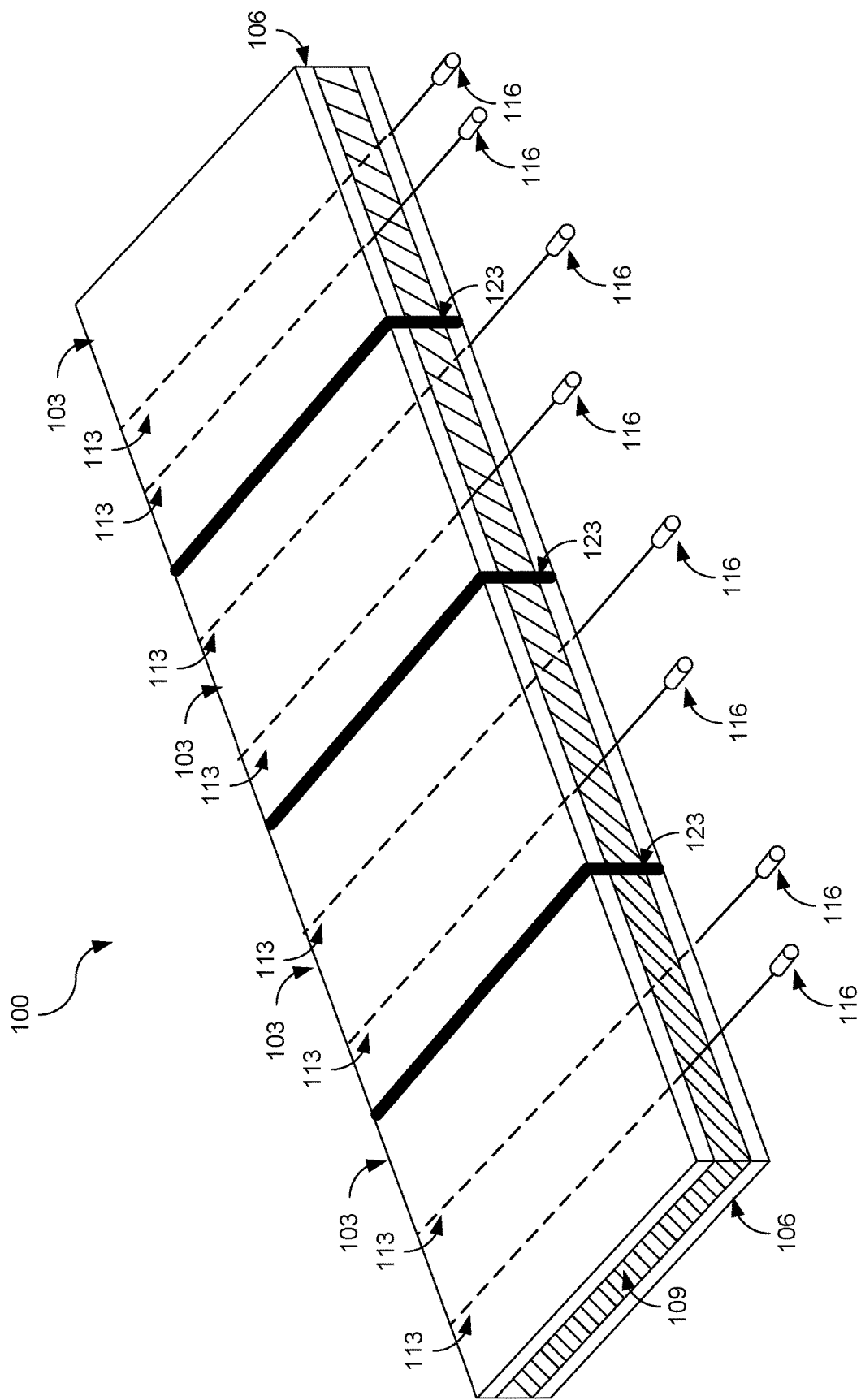
FIG. 1 depicts an example of an energy harvesting roadway according to various embodiments of the present disclosure.

FIG. 1 depicts an initial design of an energy harvesting roadway 100, which is formed from a plurality of road segments 103. Each road segment 103 has at least two conductive asphalt layers 106 and a piezoelectric-based asphalt layer 109 between the two conductive asphalt layers 106. Embedded in the conductive asphalt layers 106 are transmission lines 113. To minimize the voltage offset caused by adjacent tires on different axles of vehicles travelling across the energy harvesting roadway 100, the transmission lines 113 can be laid in a direction perpendicular to the flow of traffic. The transmission lines 113 can extend out from the conductive asphalt layers 106 to create outlet joints 116. Connected to the outlet joints 116 can be full-wave rectifiers, as discussed later.

The plurality of road segments 103 may be separated by non-conductive asphalt layers 123. The separation of the individual road segments 103 may be performed in order to prevent two adjacent vehicles from loading the same road segment 103, which can produce opposite charges and reduce the overall electric output of the road segment 103. The length of the individual road segments 103 may depend on a variety of factors, including the expected size of vehicles, the expected speed of vehicles, and potentially other factors. For example, vehicles moving at highway speeds tend to leave more space between each other for safety reasons than vehicles moving at low speeds on urban streets. Therefore, longer road segments 103 may be used on highways while shorter road segments may be used on urban or surface streets.

Figure 2:
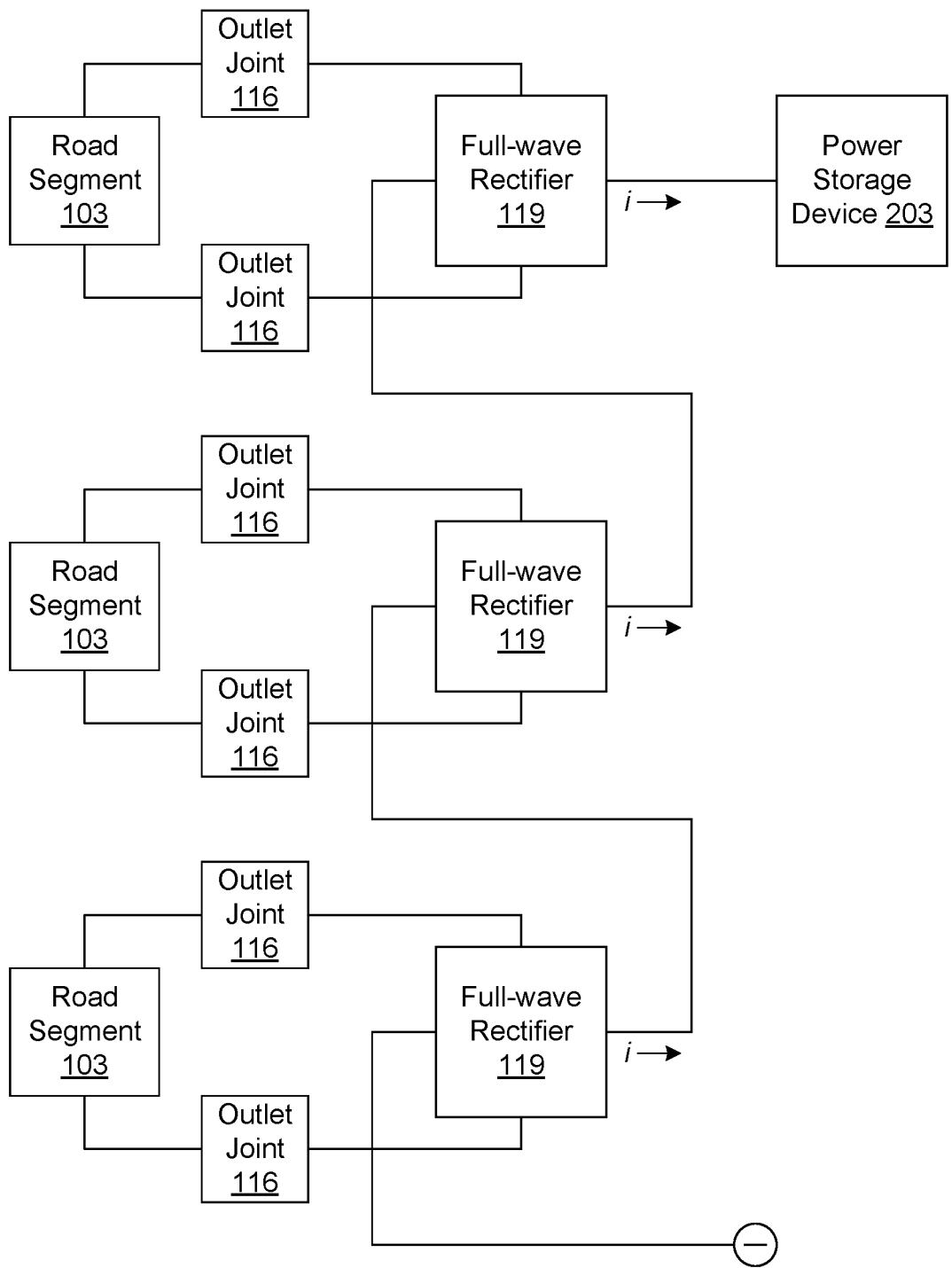
FIG. 2 depicts an example of an interconnection between outlet joints according to various embodiments of the present disclosure.

FIG. 2 depicts an example of an interconnection between outlet joints 116 to aggregate electric power for use by a power storage device 203, such as a battery, capacitor, or similar device that store an electric charge. Each outlet joint 116 is connected to a full-wave rectifier 206. A full-wave rectifier 206 may include a collection of diodes to smooth power from both positive and negative voltage outlet joints 116. As an electric current is created from deformation of the piezoelectric-based asphalt layer 109 of individual road segments 103, the current flows from the road segment 103 to the power storage device 203 as illustrated. Although FIG. 2 depicts the road segments 103 being connected in series, various embodiments of the present disclosure may connect the road segments in parallel as appropriate.

Figure 3:
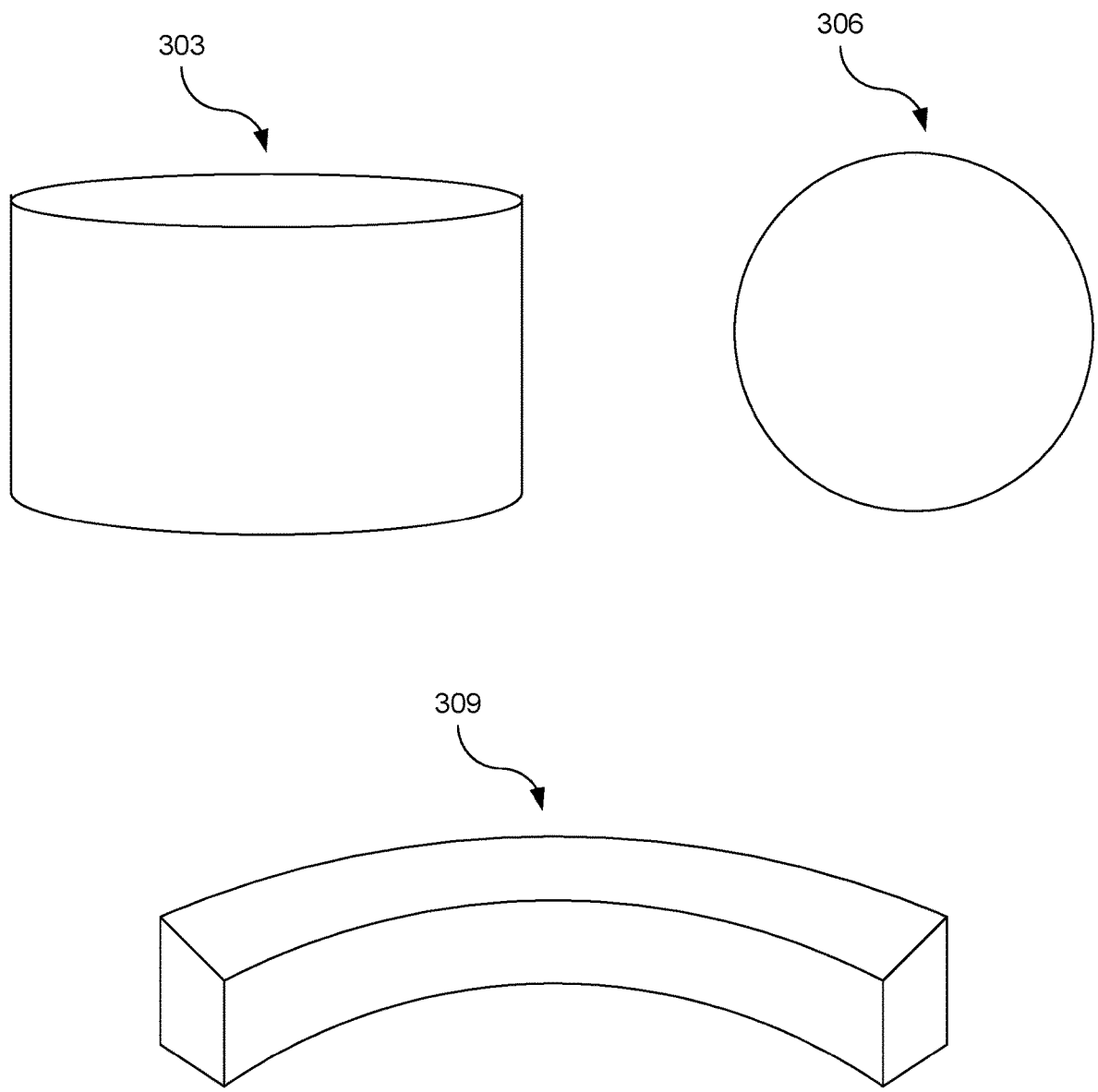
FIG. 3 depicts examples of various piezoelectric elements that may be used according to various embodiments of the present disclosure.

FIG. 3 depicts three different types of piezoelectric elements. These include a cylindrical piezoelectric element 303, a spherical piezoelectric element 306, and a concave piezoelectric element 309. The cylindrical piezoelectric element 303 may be preferentially used to produce higher voltages when the piezoelectric-based asphalt layer 109 of a road segment 103 is thick and stiff. The spherical piezoelectric element 306 can be used to decrease the overall physical stress on the element and also generate more uniform electric current directions based on the geometric stability of the sphere. The concave piezoelectric element 309 can be used to translate a high vertical impact into bending strain inside the piezoelectric component to obtain a higher voltage.

Figure 4:
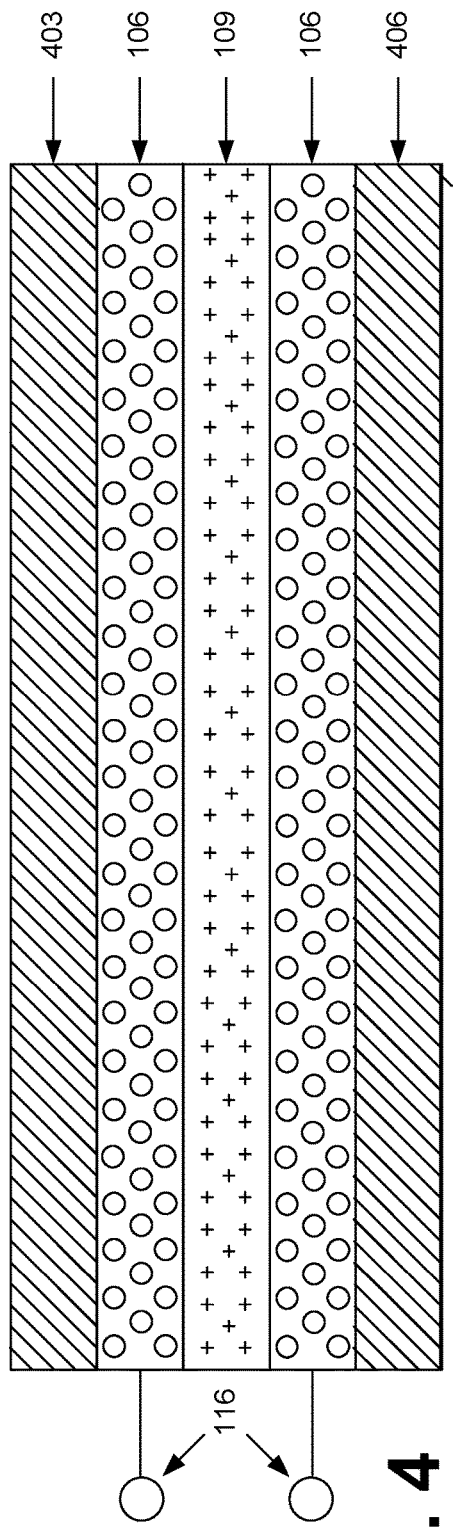
FIG. 4 depicts a cross-section of an energy harvesting roadway according to various embodiments of the present disclosure.

FIG. 4 depicts a cross-section of road segment 103 according to various embodiments of the present disclosure. As shown, a road segment 103 can include two conductive asphalt layers 106 and a piezoelectric-based asphalt layer 109. Optionally, the road segment 103 may also include a non-conductive surface asphalt layer 403 and a non-conductive base asphalt layer 406. The surface asphalt layer 403 and base asphalt layer 406 may be used in order to increase the durability of the road segment 103 as vehicles drive over the road segment 103. The surface asphalt layer 403 and base asphalt layer 406 may also provide some measure of weather-proofing for the road segment 103, preventing moisture from reaching the conductive asphalt layers 106 and the piezoelectric-based asphalt layer 109 and creating a short-circuit between the two conductive asphalt layers 106.

Figure 5:
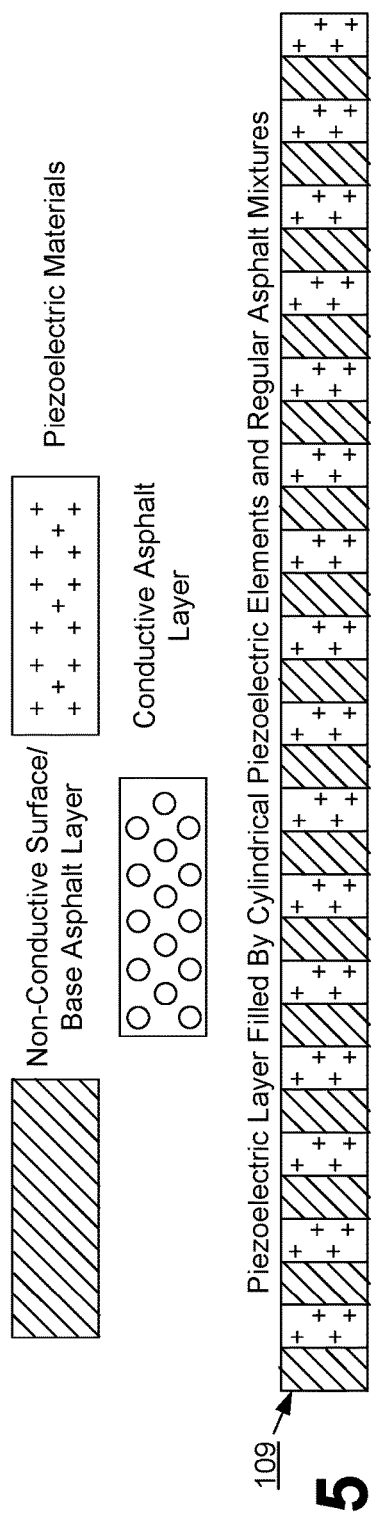
FIG. 5 depicts a cross-section of a piezoelectric-based asphalt layer including cylindrical piezoelectric elements according to various embodiments of the present disclosure.
Figure 6:
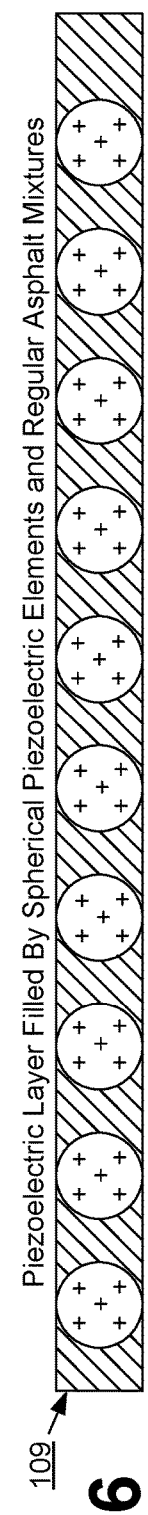
FIG. 6 depicts a cross-section of a piezoelectric-based asphalt layer including spherical piezoelectric elements according to various embodiments of the present disclosure.
Figure 7:
FIG. 7 depicts a cross-section of a piezoelectric-based asphalt layer including concave piezoelectric elements according to various embodiments of the present disclosure.

The piezoelectric-based asphalt layer 109 may be manufactured using a variety of approaches. For example, the piezoelectric-based asphalt layer 109 may include a number of piezoelectric elements, such as cylindrical piezoelectric elements 303 (FIG. 5), spherical piezoelectric elements 306 (FIG. 6), or concave piezoelectric elements 309 (FIG. 7). To prevent the piezoelectric elements from being crushed or otherwise damaged, an insulating or non-conductive filler may be mixed with the piezoelectric elements to provide stiffness to the piezoelectric-based asphalt layer 109. For example, regular asphalt or asphalt mixture may be used as a filler by mixing asphalt with the piezoelectric elements in order to create the piezoelectric-based asphalt layer 109. However, other insulating or non-conductive fillers may be used as desired. Generally, a non-conductive filler will be used in order to prevent short-circuits from forming between the two conductive asphalt layers 106.

In order to prevent moisture or water from entering the piezoelectric-based asphalt layer 109 and completing a circuit between the two conductive asphalt layers 106, some embodiments may include a waterproof layer, membrane, or other moisture barrier between the two conductive asphalt layers 106. For example, a waterproof or water resistant layer may be placed between the piezoelectric-based asphalt layer 109 and one of the conductive asphalt layers 106.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, or Z). Thus, such disjunctive language is not generally intended to, and should not, imply that certain embodiments require at least one of X, at least one of Y, or at least one of Z to each be present.

It should be emphasized that the above-described embodiments of the present disclosure are merely possible examples of implementations set forth for a clear understanding of the principles of the disclosure. Many variations and modifications may be made to the above-described embodiments without departing substantially from the spirit and principles of the disclosure. All such modifications and variations are intended to be included herein within the scope of this disclosure and protected by the following claims.

The invention claimed is:

1. An energy harvesting roadway, comprising:
a plurality of road segments, each of the plurality of road segments comprising:
a first conductive asphalt layer;
a piezoelectric-based asphalt layer located below the first conductive layer, the piezoelectric-based asphalt layer comprising:
a plurality of rigid piezoelectric elements, and
an insulating filler, and
a second conductive asphalt layer located below the piezoelectric-based asphalt layer; and
a power storage device electrically coupled to the plurality of road segments.

2. The energy harvesting roadway of claim 1, further comprising a plurality of non-conductive asphalt layers respectively disposed between adjacent ones of the plurality of road segments.

3. The energy harvesting roadway of claim 1, further comprising one or more transmission lines embedded in at least one of the first conductive asphalt layer or the second conductive asphalt layer.

4. The energy harvesting roadway of claim 3, wherein the plurality of transmission lines extend in a direction perpendicular to a flow of traffic on the energy harvesting roadway.

5. The energy harvesting roadway of claim 1, wherein respective lengths of the plurality of road segments are based on at least one of an expected size of vehicles traveling on the energy harvesting roadway or an expected speed of vehicles traveling on the energy harvesting roadway.

6. The energy harvesting roadway of claim 1, further comprising a plurality of full-wave rectifiers, each full-wave rectifier electrically connected between a respective one of the plurality of road segments and the power storage device.

7. The energy harvesting roadway of claim 1, wherein the power storage device is a capacitor.

8. The energy harvesting roadway of claim 1, wherein the power storage device is a rechargeable battery.

9. The energy harvesting roadway of claim 1, wherein the plurality of road segments are electrically coupled to the power storage device in parallel.

10. The energy harvesting roadway of claim 1, wherein the plurality of road segments are electrically coupled to the power storage device in series.

11. The energy harvesting roadway of claim 1, wherein each of the plurality of road segments further comprises a waterproof layer between the first and second conductive asphalt layers.

12. The energy harvesting roadway of claim 1, wherein the plurality of rigid piezoelectric elements comprise a plurality of cylindrically shaped rigid piezoelectric elements.

13. The energy harvesting roadway of claim 1, wherein the plurality of rigid piezoelectric elements comprise a plurality of spherically shaped rigid piezoelectric elements.

14. The energy harvesting roadway of claim 1, wherein the plurality of rigid piezoelectric elements comprise a plurality of concave rigid piezoelectric elements.

15. The energy harvesting roadway of claim 1, wherein the insulating filler has a stiffness of three (3) MPa or less.

16. The energy harvesting roadway of claim 1, wherein the insulating filler has a stiffness of less than thirty (30) MPa.

17. A method of manufacturing an energy harvesting roadway, comprising:
manufacturing a plurality of road segments, comprising:
providing a first conductive asphalt layer,
providing a piezoelectric-based asphalt layer located below the first conductive layer, the piezoelectric-based asphalt layer comprising a plurality of rigid piezoelectric elements and an insulating filler, and
providing a second asphalt layer located below the piezoelectric-based asphalt layer.

18. The method of claim 17, wherein providing the piezoelectric-based asphalt layer includes:
providing the plurality of rigid piezoelectric elements; and
mixing the plurality of rigid piezoelectric elements with the rigid filler.

19. The method of claim 17, further comprising:
providing respective ones of a plurality of non-conductive asphalt layers between adjacent ones of the plurality of road segments.

20. The method of claim 17, further comprising:
electrically coupling a power storage device to the plurality of road segments.

\* \* \* \* \*